United States Patent [19]
Simmons et al.

[11] Patent Number: 5,454,118
[45] Date of Patent: Sep. 26, 1995

[54] METHOD AND APPARATUS FOR PREVENTION OF SQUELCH CHATTER

[75] Inventors: John W. Simmons, Tamarac; Walter H. Kehler, Jr., Sunrise, both of Fla.

[73] Assignee: Motorola, Inc., Schaumburg, Ill.

[21] Appl. No.: 219,248

[22] Filed: Mar. 28, 1994

Related U.S. Application Data

[63] Continuation of Ser. No. 740,268, Aug. 5, 1991, abandoned.

[51] Int. Cl.⁶ ................................................ H04B 1/10
[52] U.S. Cl. ........................ 455/221; 455/220; 455/225
[58] Field of Search .................................. 455/212, 213, 455/218, 220, 222, 223, 296, 312, 225, 221

[56] References Cited

U.S. PATENT DOCUMENTS

| | | | |
|---|---|---|---|
| 3,534,268 | 10/1970 | Mazziota et al. | 455/220 |
| 3,851,253 | 11/1974 | Eastmond | 455/222 |
| 3,934,206 | 1/1976 | Holecek | 455/220 |
| 4,132,953 | 1/1979 | Martin, III | 325/478 |
| 4,388,731 | 6/1983 | King | 455/221 |
| 4,637,066 | 1/1987 | Kennedy | 455/223 |
| 4,947,456 | 8/1990 | Atkinson et al. | 455/218 |
| 4,991,227 | 2/1991 | Kehler, Jr. | 455/221 X |

OTHER PUBLICATIONS

"Syntor X" Instruction Manual; Motorola, Inc. published Oct. 2, 1981; Chapter Receiver, sections 2.4 and 2.5 plus schematic diagram.
"Nucleus I.C." Ed Clark, John Fuerst and Jim Kimball; unpublished, but describes a product on sale in the U.S. in 1979, pp. 88–105 only.

*Primary Examiner*—Edward F. Urban
*Attorney, Agent, or Firm*—M. Mansour Ghomeshi

[57] ABSTRACT

A squelch circuit (118) is provided having a squelch hysteresis window for preventing squelch chatter in a communication device (100). The communication device (100) includes a plurality of squelch states. The squelch circuit (118) comprises a first means (206) for sensing when the communication device (100) is in a first squelch state. The squelch circuit (118) also includes a second means (116) which is responsive to the first means (206) for varying the squelch hysteresis window to prevent squelch chatter.

4 Claims, 3 Drawing Sheets

METHOD AND APPARATUS FOR PREVENTION OF SQUELCH CHATTER

This is a continuation of application Ser. No. 07/740,268, filed Aug. 5, 1991, and now abandoned.

TECHNICAL FIELD

This invention relates generally to receivers and is particularly directed towards receivers utilizing noise squelch.

BACKGROUND

The use of squelch circuits in communication devices is widely common. These circuits are basically used to squelch a receiver during the no-activity periods. The increase in the noise floor at instances when no signal is present is detected and caused to quiet the receiver. A received signal opens the receiver due to the significant reduction in the noise floor level. Two commonly used terminologies "threshold" and "tight" refer to when the squelch setting is at the threshold of being open and when a strong signal is needed to open the squelch, respectively. In the latter, the noise arrives at the low pass filter nearly unattenuated. This large peak to peak noise is significantly smoothed by the low pass filter. However, the filtered ripple is still noticeable. If the peak to peak ripple after the low pass filter exceeds the hysteresis voltage, the squelch will open on the high peak. The next low transition of this ripple voltage will be below the hysteresis point causing the squelch to close. The repetition of this phenomenon results in chatter which is highly undesirable, particularly in tight squelch conditions. One approach to eliminate squelch chatter is to implement a wide squelch hysteresis window. However, this would result in undesirable performance at threshold or during strong signal conditions because of longer than desirable squelch tails that are unavoidable with wide hysteresis windows. It is therefore clear that a need exists for a squelch circuit that can prevent squelch chatter without incurring any of the aforementioned deficiencies.

SUMMARY OF THE INVENTION

A squelch circuit is provided having a squelch hysteresis window for preventing squelch chatter in a communication device. The communication device includes a plurality of squelch states. The squelch circuit comprises a first means for sensing when the communication device is in a first squelch state. The squelch circuit also includes a second means which is responsive to the first means for varying the squelch hysteresis window to prevent squelch chatter.

DETAILED DESCRIPTION OF THE PREFERRED EMBODIMENT

Figure 1:
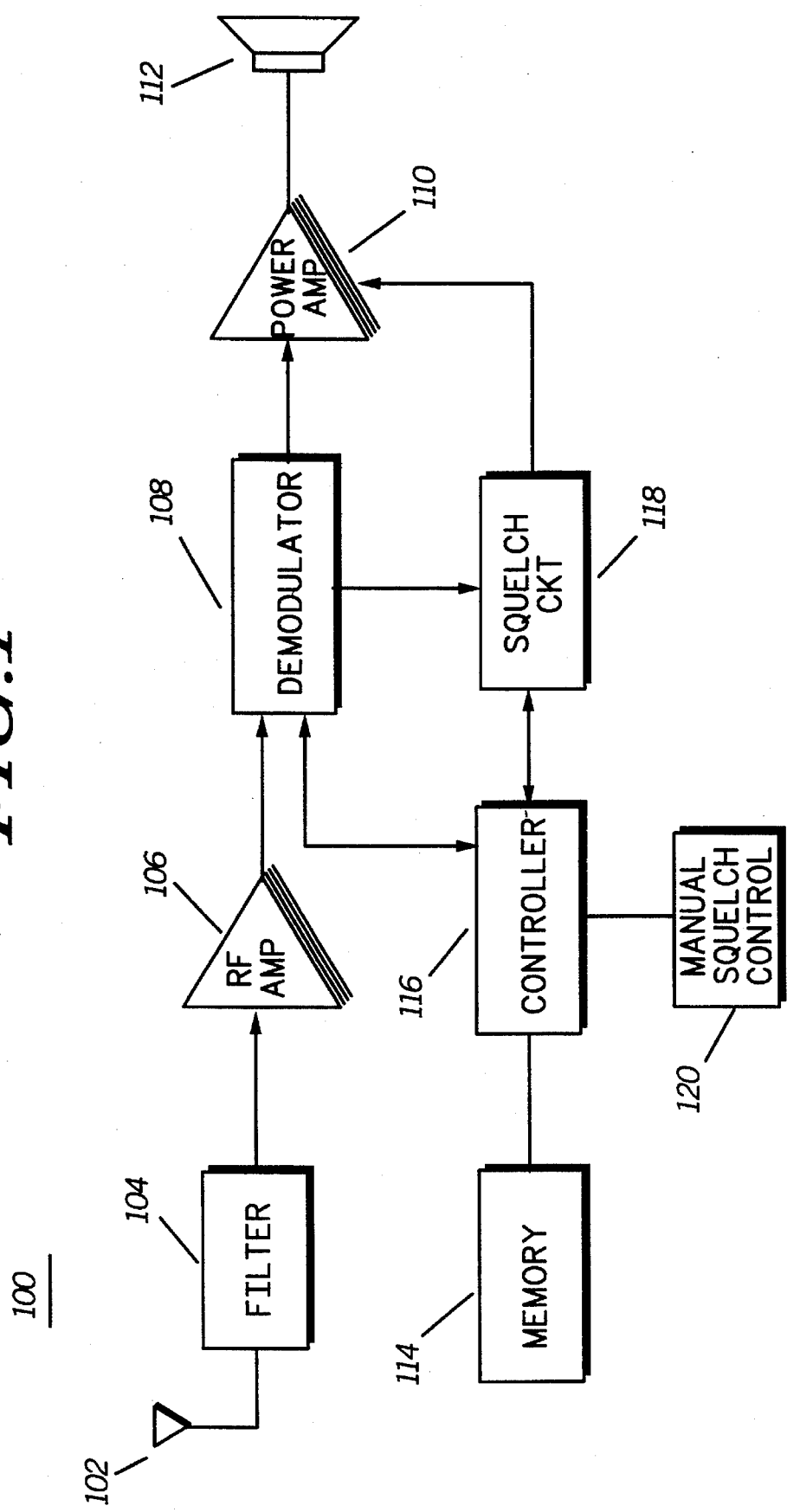
FIG. 1 shows a block diagram of a receiver in accordance with the principles of the present invention.

Referring to FIG. 1, a block diagram of a receiver 100 is shown in accordance with the present invention. A radio frequency signal is received at an antenna 102 is filtered by a filter 104 and amplified by an amplifier 106. The amplified radio frequency signal is applied to a demodulator 108 where it is demodulated. The demodulator 108 is coupled to a power amplifier 110, a squelch circuit 118, and a controller 116. The controller 116 controls the operation of the demodulator 108 and the squelch circuit 118. Coupled to the controller 116 is a memory block 114 which provides storage means for the controller 116. The squelch circuit 118 provides squelch control for the demodulator 108 and hence the receiver 100. A speaker 112 is coupled to the output of the power amplifier 110 to present demodulated audio signals to a user. The operation of receivers having squelch circuits is well known in the art. Generally, the squelch circuit 118 evaluates the level of noise being received by the antenna 102 and determines if signal is being received. This provides the user with the benefit of not having to continuously listen to noise while awaiting intelligent data to arrive.

The controller 116 controls the operation of the squelch circuit 118 automatically. The settings of the squelch circuit 118 are stored in the memory block 114 and dictated to the squelch circuit 118 via the controller 116. The information contained in the memory 114 include threshold hysteresis that are used by the squelch circuit 118 to avoid instability. To provide manual control of the squelch circuit 118 an optional manual squelch control 120 can be coupled to the controller 116. The manual squelch control 120 allows the squelch circuit 118 to be manually set to particular levels as deemed desirable by the user.

Figure 2:
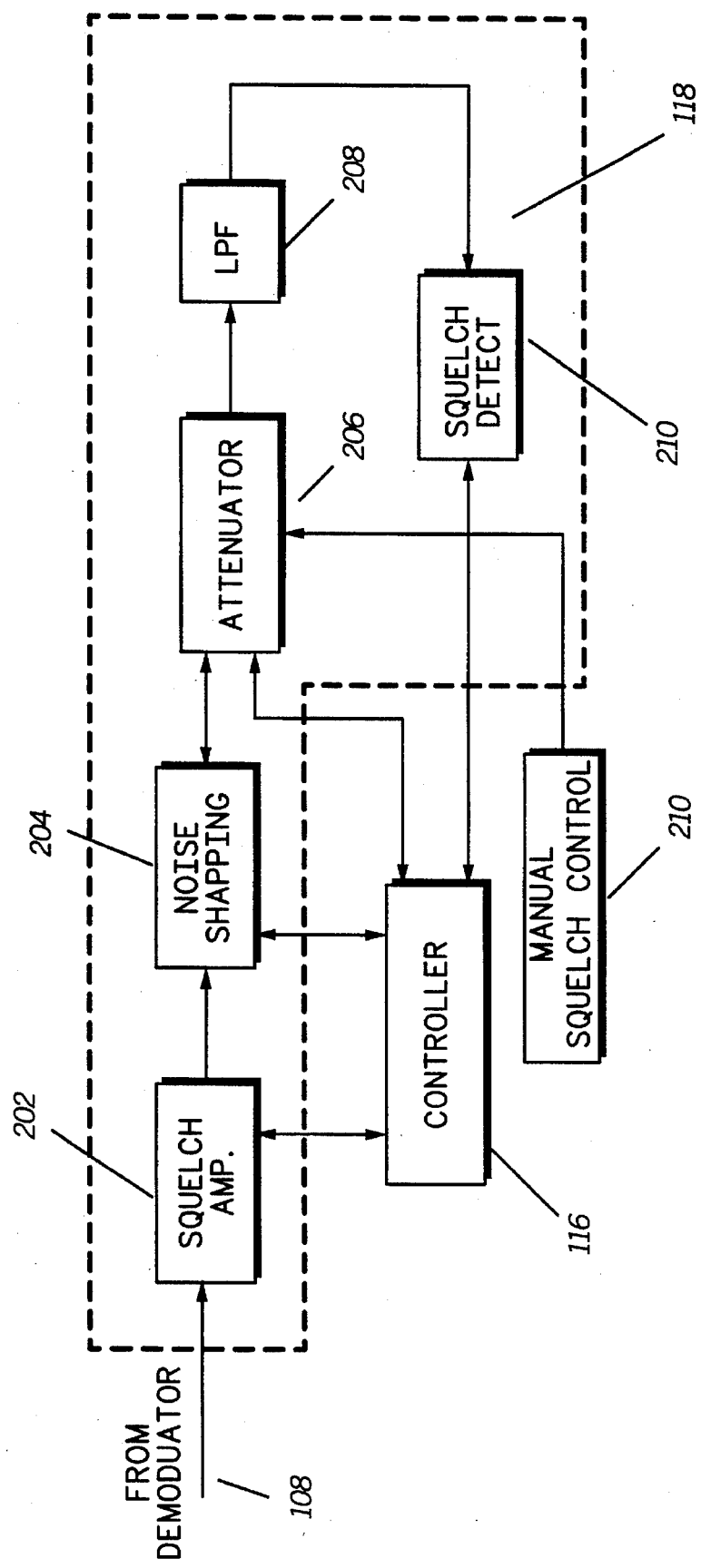
FIG. 2 shows a block diagram of a squelch circuit in accordance with the present invention.

Referring to FIG. 2 a block diagram of the internal elements of the squelch circuit 118 is shown in accordance with the present invention. Signals from the demodulator 108 are amplified by the squelch amplifier 202. A noise shaping block 204 receives the amplified squelch signal from the squelch amplifier 202. The noise shaping 204 includes such circuits as pre-emphasis filters and rectifiers. The noise shaping is accomplished to facilitate a determination as to whether the receiver 100 is receiving a signal. In other words, the received noise is shaped to quickly determine as to whether the receiver 100 should be quieted. The output of the noise shaping 204 is coupled to an attenuator 206 where it is attenuated. The attenuated signal is filtered by a low pass filter 208 and coupled to a squelch detect 210. The attenuator 206 is a step attenuator and preferably a programmable one. The controller 116 controls the operation of the squelch amplifier 202, the noise shaping 204, the attenuator 206, and the squelch detect circuit 210. The squelch setting of the receiver 100 is determined by the attenuation setting of the attenuator 206. The attenuation setting is either dictated by the manual squelch control 120 or automatically set by the controller 116. In either case the attenuation level of the attenuator 206 provides the means for sensing the squelch state of the receiver 100. The attenuator 206 communicates the squelch state to the controller 116. Note that it is feasible to use the attenuator 206 only as the means to dictate the squelch setting of the receiver 100. In this case the controller 116 will sense the squelch state based on the setting of the attenuator 206. When threshold squelch is desired, the squelch control either manually or from the controller 116 adjusts the attenuation of the attenuator 206 at an optimal place sufficient to achieve threshold squelch. In the event that tight squelch is desired, the attenuation of the attenuator 206 is reduced to minimum. In other words, the noise signal at the output noise shaping circuit 204 is applied to the low pass filter 208 with minimum or no attenuation. The squelch detect circuit 210 includes hysteresis circuits with controllable windows. The width of these windows are controlled by the controller 116 in response to the squelch information available from the attenuator 206 and from the strong signal condition available from the squelch detector 210. The instantaneous setting of the attenuator 206 is communicated to the various elements of the receiver 100 via the controller 116. With the knowledge of the instantaneous setting of the attenuator 206, the controller 116 can determine whether the squelch circuit 118 is in tight or threshold squelch. In the preferred embodiment, upon detecting the tight squelch condition the controller 116 proceeds to vary the hysteresis window to prevent squelch chatter This is discussed in more details in association with the flow chart of FIG. 3.

Those skilled in the art appreciate the use of other squelch circuits to achieve similar results. Indeed, an amplifier circuit could be used in place of the attenuator 206 to provide the sensing means for the squelch circuit 118. The elements of the receiver 100 and the squelch circuit 118 are presented here to provide the preferred embodiment of the invention. However, they should not be construed as limitations. Nor shall they be held as the only possible means of putting the present invention to work. Changes are possible without significant departure form the spirit of the invention as claimed.

Figure 3:
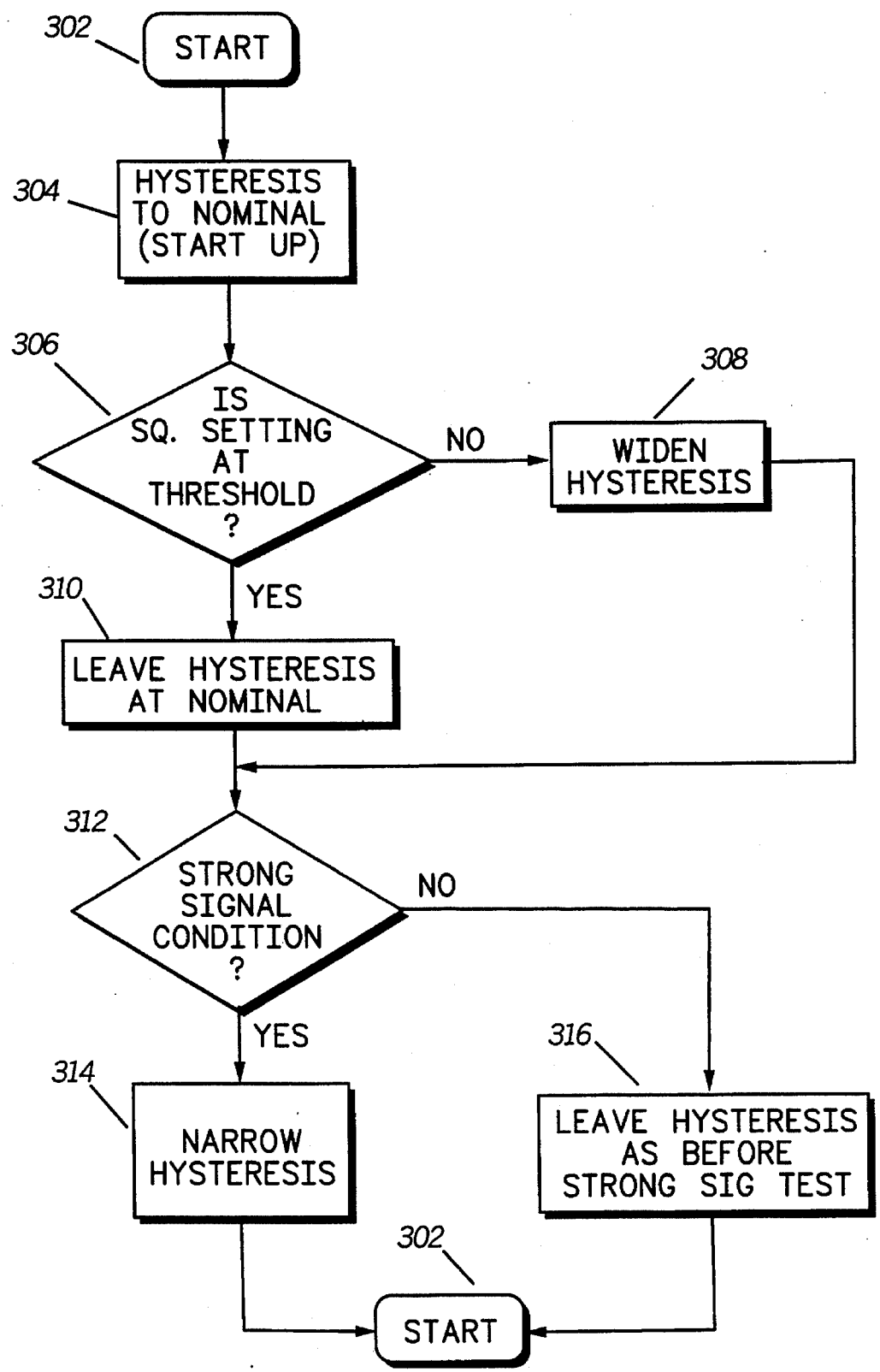
FIG. 3 shows a flow chart of the operation of the squelch circuit of FIG. 2 in accordance with the present invention.

Referring now to FIG. 3, a flow chart of the operation of the squelch circuit 118 in setting the hysteresis windows is shown in accordance with the principles of the present invention. From a start block 302, the operation sets the hysteresis at normal as indicated by block 304. With the hysteresis at normal, a condition block 306 determines if the squelch setting is at threshold. The yes output of the block 306 is coupled to a leave hysteresis at nominal block 310. The output of block 310 is coupled to a condition block 312 where the presence of a strong signal condition is questioned. The NO output of the condition block 306 indicating that the squelch setting is not at threshold is coupled to a widen hysteresis block 308. At the block 308, the hysteresis is widened to accommodate tight squelch conditions. The output of this block is coupled to the input of the condition block 312. The NO output of the condition block 312 indicating the absence of a strong signal condition is coupled to a block 316 where the hysteresis remains unchanged. The YES output of the condition block 312 is coupled to a block 314 where the hysteresis is narrowed. As an example, the hysteresis is narrowed to half of the nominal hysteresis window. With the hysteresis window narrowed, the short squelch tail is guaranteed for strong signal conditions at either threshold or tight squelch. The wide or nominal hysteresis conditions as dictated by block 316 assure that no chatter is present at tight squelch.

To summarize, a circuit is shown to prevent chatter at tight squelch settings while still maintaining reasonable threshold hysteresis and short tail ends during strong signal conditions. With the inclusion of the attenuator 206 in the squelch circuit 118 it is possible to widen or constrict squelch hysteresis as a function of the attenuator setting and the magnitude of the incoming signal at the antenna 102. The flow chart 300 will ensure a short squelch tail for strong signal conditions at either threshold or tight squelch by narrowing up the squelch hysteresis. In addition, the squelch circuit 118 prevents chatter at tight squelch settings without sacrificing threshold or strong signal performance.

What is claimed is:

1. A squelch circuit having a variable squelch hysteresis window for minimizing squelch chatter in a communication device, the squelch circuit having a plurality of squelch states including a tight squelch state and a threshold squelch state, the squelch circuit comprising:

a variable attenuator circuit having a plurality of attenuation settings, the attenuator circuit having means for determining the squelch state of the communication device; and controller means responsive to the variable attenuator circuit and the magnitude of an incoming signal for widening the squelch hysteresis window in response to the attenuation setting of the variable attenuator circuit and the magnitude of the incoming signal having a level below a threshold for dynamically minimizing squelch chatter at weak signal conditions and narrowing the squelch hysteresis window in response to the attenuation setting of the variable attenuator circuit and the magnitude of the incoming signal having a level above a threshold in order to guarantee short squelch tail at strong signal conditions.

2. The squelch circuit of claim 1, wherein the attenuator circuit includes a programmable attenuator.

3. The squelch circuit of claim 1, wherein the sensing means includes means for sensing when the squelch state of the communication device is in the tight state.

4. A communication device having a squelch circuit having a variable squelch hysteresis window for minimizing squelch chatter in the communication device, the squelch circuit having a plurality of squelch states including a tight squelch state and a threshold squelch state, the squelch circuit comprising:

a variable attenuator circuit having a plurality of attenuation settings, the attenuator circuit having means for determining the squelch state of the communication device; and controller means responsive to the variable attenuator circuit and the magnitude of an incoming signal for widening the squelch hysteresis window in response to the attenuation setting of the variable attenuator circuit and the magnitude of the incoming signal having a level below a threshold for dynamically minimizing squelch chatter at weak signal conditions and narrowing the squelch hysteresis window in response to the attenuation setting of the variable attenuator circuit and the magnitude of the incoming signal having a level above a threshold in order to guarantee short squelch tail at strong signal conditions.

* * * * *